(12) United States Patent
Chida

(10) Patent No.: US 6,510,090 B1
(45) Date of Patent: Jan. 21, 2003

(54) SEMICONDUCTOR MEMORY DEVICE

(75) Inventor: Tetsuya Chida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/103,721

(22) Filed: Mar. 25, 2002

(30) Foreign Application Priority Data

Oct. 3, 2001 (JP) ........................................ 2001-307207

(51) Int. Cl.[7] ................................................ G11C 7/00
(52) U.S. Cl. ...................... 365/195; 365/195; 365/196; 365/228; 365/189.04; 365/189.07
(58) Field of Search ................................ 365/195, 196, 365/228, 189.04, 189.07

(56) References Cited

U.S. PATENT DOCUMENTS 5,896,325 A * 4/1999 Kujioka ................. 365/189.07
5,991,197 A * 11/1999 Ogura et al. ............ 365/185.04
6,097,666 A * 8/2000 Sakui et al. ............ 365/185.11
6,252,800 B1 * 6/2001 Chida .................... 365/185.11

FOREIGN PATENT DOCUMENTS

JP 01-277370 11/1989

* cited by examiner

Primary Examiner—Andrew Q. Tran
Assistant Examiner—Toan Le
(74) Attorney, Agent, or Firm—Arent Fox Kintner Plotkin & Kahn, PLLC

(57) ABSTRACT

In the semiconductor memory device of the present invention, a page buffer holds read data read from a memory cell selected from among a plurality of memory cell blocks, and outputs the held data in order. That is, read data is read not directly from the memory cell blocks but through the page buffer. A password control circuit compares a read password supplied during a read operation with an original password stored in advance, and outputs the result of comparison. A buffer control circuit changes the order the read data is output from the page buffer when the result of comparison is a mismatch. In other words, the page buffer outputs the read data in predetermined order when the read password is correct, and outputs the read data in random order when the read password is incorrect. This realizes security protection of the data written in the semiconductor memory device.

9 Claims, 3 Drawing Sheets

SEMICONDUCTOR MEMORY DEVICE

BACKGROUND OF THE INVENTION

1. Field of the Invention

The present invention relates to a semiconductor memory device having a security protection mechanism. In particular, the present invention relates to a security protection mechanism of an electrically rewritable nonvolatile semiconductor memory device.

2. Description of the Related Art

Recently, flash memories which are electrically rewritable of data and fully (or partly) erasable of data have been developed as core products of nonvolatile semiconductor memory devices. In particular, flash memories containing series of memory cells called NAND types (NAND type flash memories) find wide use as mass storage devices intended for file applications.

Generally, a NAND type flash memory has no address terminal or command terminal. Addresses, commands (executable instructions), and data are all input or output through input/output terminals. The addresses and commands supplied from exterior are stored into an address register and a command register, respectively. The write data supplied from exterior and the read data read from a memory core are temporarily stored in a page buffer (data register). The page buffer operates by having the memory regions in the page buffer selected by pointer values. The page buffer typically has the same memory capacity as that of a page (the unit by which data is read/written from/to the memory core) a plurality of which are formed in the memory core.

In a read operation of the NAND type flash memory described above, a command (read instruction) is supplied initially. The supplied command is stored in the command register. Next, the read start address of data is supplied in three. These addresses are stored in the address register.

Subsequently, the read operation is started and a page of data is transferred from the memory core to the page buffer. The data transferred to the page buffer is successively output through the input/output terminals in synchronization with a read enable signal (clock) which is supplied to a read enable terminal. More specifically, the value of the pointer is incremented by one in synchronization with the read enable signal, and the read data is output in succession from the memory regions selected by the pointer values.

In recent years, needs have been growing for the security protection of data stored in storage media intended for digital equipment (memory cards etc.) which use nonvolatile semiconductor memory devices including flash memories. For example, when personal information is stored in the storage media, the information must be prevented from easy read. Nevertheless, conventional flash memories and the like have no security protection mechanism, which gives rise to the problem that personal information and the like can be read easily. For example, flash memories output data whenever they receive read instructions from exterior.

Security protection mechanisms may be added to storage media that implement flash memories. Storage media, however, are desired to be compact and inexpensive. Accordingly, the addition of new circuits for security protection to the system substrates of the storage media has difficulties that the storage media become greater in outer dimensions and that they increase in cost.

Japanese Unexamined Patent Application Publication No. Hei 1-277370 discloses a technology for security protection of image information to be recorded on an image recording apparatus. This image recording apparatus records image information in the form of random data by changing the order of recording in accordance with a password input upon recording the image information. To read the image information, a password is input again. The image recording apparatus outputs the random data as-is if the passwords do not match with each other. If the passwords match, the image recording apparatus rearranges the random data according to the password and outputs the resultant as the original image information.

In this type of security protection technology, however, it has been necessary to manipulate the sequence of data both in writing and in reading the data. Moreover, at the time of writing, the sequence of image data must be changed to generate random data before the random data is written to a memory circuit. This increases the circuit scale of the write control circuit, and requires enormous amounts of write time.

SUMMARY OF THE INVENTION

An object of the present invention is to provide a semiconductor memory device which can realize security protection of data with simple control circuitry.

Another object of the present invention is to provide a semiconductor memory device which can realize security protection of data without much modification in architecture.

According to one of the aspects of the semiconductor memory device of the present invention, a page buffer holds read data read from a memory cell selected from among a plurality of memory cell blocks, and outputs the held data in order. That is, read data is read not directly from the memory cell blocks but through the page buffer. A password control circuit compares a read password supplied during a read operation with an original password stored in advance, and outputs the result of comparison. A buffer control circuit changes the order the read data is output from the page buffer when the result of comparison is a mismatch. In other words, the page buffer outputs the read data in predetermined order when the read password is correct, and outputs the read data in random order when the read password is incorrect. This realizes security protection of the data written in the semiconductor memory device. Since the security protection is exercised in read operations according to the read password, the control circuitry necessary for data write operations may be the same as in conventional art. The arrangement of the data written to the memory cell blocks is also the same as in conventional art. For this reason, the security protection of the data can be effected simply by modifying a part of the buffer control circuit and providing a new password control circuit. Consequently, the security protection mechanism can be added with a minimum increase in chip size.

Incidentally, when the read password is incorrect, read data is output although it is in random order. Therefore, those who try to read data illicitly cannot determine whether the output data is correct or not. This allows enhanced security protection as compared with the case of simply judging passwords.

According to another aspect of the semiconductor memory device of the present invention, the page buffer has a plurality of memory regions for holding the read data, respectively. The buffer control circuit includes a pointer control circuit. The pointer control circuit generates pointer values for selecting which of the memory regions to output the read data to. Then, the pointer control circuit puts the pointer values in proper order when the result of comparison of the passwords is a match, and puts the pointer values in random order when the result of comparison of the passwords is a mismatch. For example, when the result of comparison of the passwords is a mismatch, the pointer control circuit increments the pointer values by two or by three. Alternatively, the pointer control circuit stops updating the pointer values and outputs identical pointer values. As a result, the security protection of the data can be easily achieved by simply manipulating the pointer values according to the read password.

According to another aspect of the semiconductor memory device of the present invention, the semiconductor memory device comprises a pitch memory circuit for storing the pitch in the pointer values to be used when the result of comparison is a mismatch. Therefore, the pitch between the pointer values can be set freely by, for example, manufacturers of semiconductor memory devices or manufacturers of memory cards that implement semiconductor memory devices. Semiconductor memory devices having various pitches in the pointer values can be shipped for sure prevention of being read illicitly. According to another aspect of the semiconductor memory device of the present invention, a write inhibition circuit stores write information indicating that the pitch between the pointer values is written to the pitch memory circuit. When it contains the write information, the write inhibition circuit inhibits thereafter any write to the pitch memory circuit. Therefore, it is possible to prevent the pitches written by the manufacturers from being tampered.

According to another aspect of the semiconductor memory device of the present invention, the pitch memory circuit and the write inhibition circuit include electrically rewritable nonvolatile memory elements for storing the pitch and the write information, respectively. Therefore, even when power is not supplied to the semiconductor memory device, the pitch in the pointer values and the write information can be prevented from disappearing.

According to another aspect of the semiconductor memory device of the present invention, the password control circuit includes an original password memory part for storing the original password. The original password memory part is composed of an electrically rewritable nonvolatile memory element. Therefore, even when power is not supplied to the semiconductor memory device, the original password can be prevented from disappearing.

According to another aspect of the semiconductor memory device of the present invention, the semiconductor memory device is formed as a NAND type flash memory. A NAND type flash memory typically has a plurality of memory cell blocks (pages), a page buffer having a memory capacity corresponding to the memory capacity of a page, and a buffer control circuit for controlling the page buffer. Therefore, the NAND type flash memory having a security protection mechanism can be easily developed by simply modifying a part of the conventional circuits.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENT

Hereinafter, an embodiment of the present invention will be described with reference to the drawings.

Figure 1:
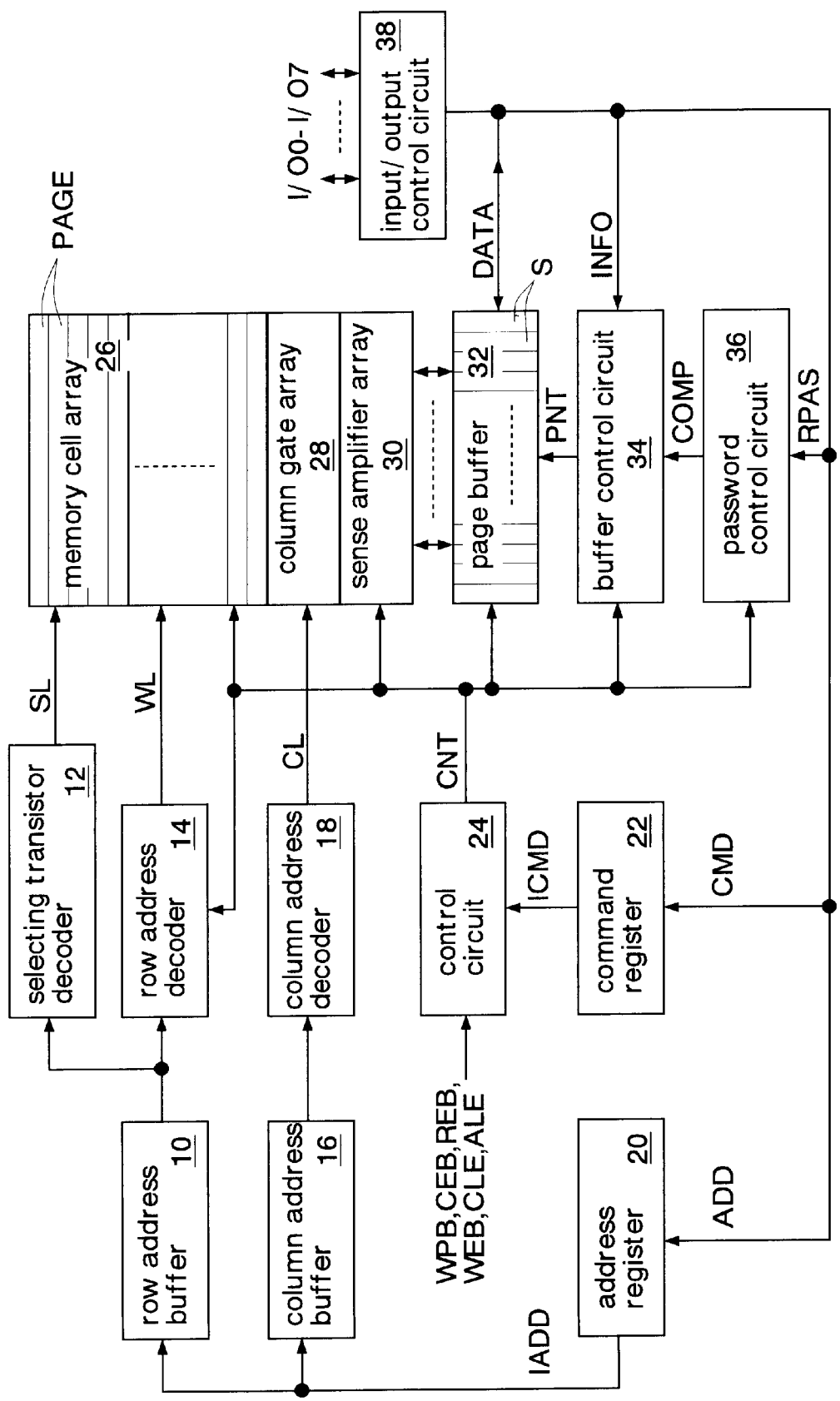
FIG. 1 is a block diagram showing an embodiment of the present invention.

FIG. 1 shows an embodiment of the semiconductor memory device of the present invention. This semiconductor memory device is formed as a NAND type flash memory on a silicon substrate by using CMOS processes.

The flash memory has a row address buffer 10, a selecting transistor decoder 12, a row address decoder 14, a column address buffer 16, a column address decoder 18, an address register 20, a command register 22, a control circuit 24, a memory cell array 26, a column gate array 28, a sense amplifier array 30, a page buffer 32, a buffer control circuit 34, a password control circuit 36, and an input/output control circuit 38.

The row address buffer 10 receives an internal address IADD (upper address; block address and page address) output from the address register 20, and outputs the address received to the selecting transistor decoder 12 and the row address decoder 14. The selecting transistor decoder 12 decodes the address received and outputs a selecting line signal SL. The row address decoder 14 decodes the address received and outputs a word line signal WL.

The column address buffer 16 receives the internal address IADD (lower address) output from the address register 20, and outputs the address received to the column address decoder 18. The column address decoder 18 decodes the address received and outputs a column selecting signal CL.

The address register 20 holds an address ADD supplied from exterior through the input/output control circuit 38, and outputs the held address ADD as the internal address IADD. The command register 22 holds a command CMD supplied from exterior through the input/output control circuit 38, and outputs the held command CMD as an internal command ICMD.

The control circuit 24 is activated in accordance with the internal command ICMD. The control circuit 24 generates a plurality of control signals CNT for controlling the row address decoder 14, the memory cell array 26, the sense amplifier array 30, the page buffer 32, the buffer control circuit 34, and the password control circuit 36, respectively, according to a write protect signal WPB, a chip enable signal CEB, a read enable signal REB, a write enable signal WEB, a command latch enable signal CLE, and an address latch enable signal ALE. Here, the signals ending in "B" are of negative logic.

The memory-cell array 26 has, for example, 16 k pages PAGE (memory cell blocks) each including 4 kbits (512 bits×8 I/Os) of memory cells. That is, this flash memory has a memory capacity of 64 Mbits. Although not shown in particular, the pages PAGE contain series of 16 memory cells, across each of which are arranged selecting transistors. One of the selecting transistors is connected to a bit line at its input/output node. The memory cells have a control gate and a floating gate each. The control gates receive the word line signal WL The gates of the selecting transistors receive the selecting line signal SL. In reality, every 32 pages PAGE constitute a block. These blocks are selected by the block address.

The column gate array 28 has a plurality of column switches (not shown) for establishing connection between the bit lines in the memory cell array 26 and the sense amplifiers in the sense amplifier array 30. The gates of the column switches (transistors) receive the column selecting signal CL. The data amplified by the sense amplifiers in the sense amplifier array 30 is output to the page buffer 32 (read operation), or written to the memory cell array 26 through the column switches (write operation).

The page buffer 32 has a memory capacity of 4 kbits (512 bits×8 I/Os), the same as the memory capacity of a single page. That is, the page buffer 32 has 512 (512 bytes of) memory regions S. In read operations, the page buffer 32 receives data as much as a single page of the memory cell array 26. Then, the data held in the memory regions S that are pointed by a pointer PNT is output successively as data DATA in synchronization with the control signal CNT. In write operations, the page buffer 32 operates in synchronization with the control signal CNT and stores the data DATA (write data) supplied successively into the memory regions S that are pointed by the pointer PNT. Subsequently, the page buffer 32 transfers a page of data to the memory cell array 26. That is, read operations and write operations to the memory cell array 26 are performed in units of a single page (in units of the page buffer).

The buffer control circuit 34 operates in synchronization with the control signal CNT and changes the pointer PNT sequentially in accordance with a comparison result signal COMP. The comparison result signal COMP, as will be described later, turns to low level when a read password RPAS supplied in a read operation is correct, and turns to high level when the read password RPAS is incorrect. Then, the buffer control circuit 34 increments the pointer PNT by one when the read password RPAS is correct, and increments the pointer PNT by two when the read password RPAS is incorrect. Alternatively, the buffer control circuit 34 outputs identical pointer values, not updating the pointer PNT. Incidentally, the pitch in the pointer PNT for incorrect read passwords RPAS is set in advance by means of an information signal INFO which is supplied from exterior through the input/output control circuit 38.

The password control circuit 36 operates in synchronization with the control signal CNT and compares the read password RPAS supplied in a read operation and an original password set in advance. The result of comparison is output as the comparison result signal COMP.

The input/output control circuit 38 receives the address ADD, the command CMD, the read password RPAS, and the information signal INFO, and inputs/outputs data DATA through its input/output terminals I/O0–I/O7.

Figure 2:
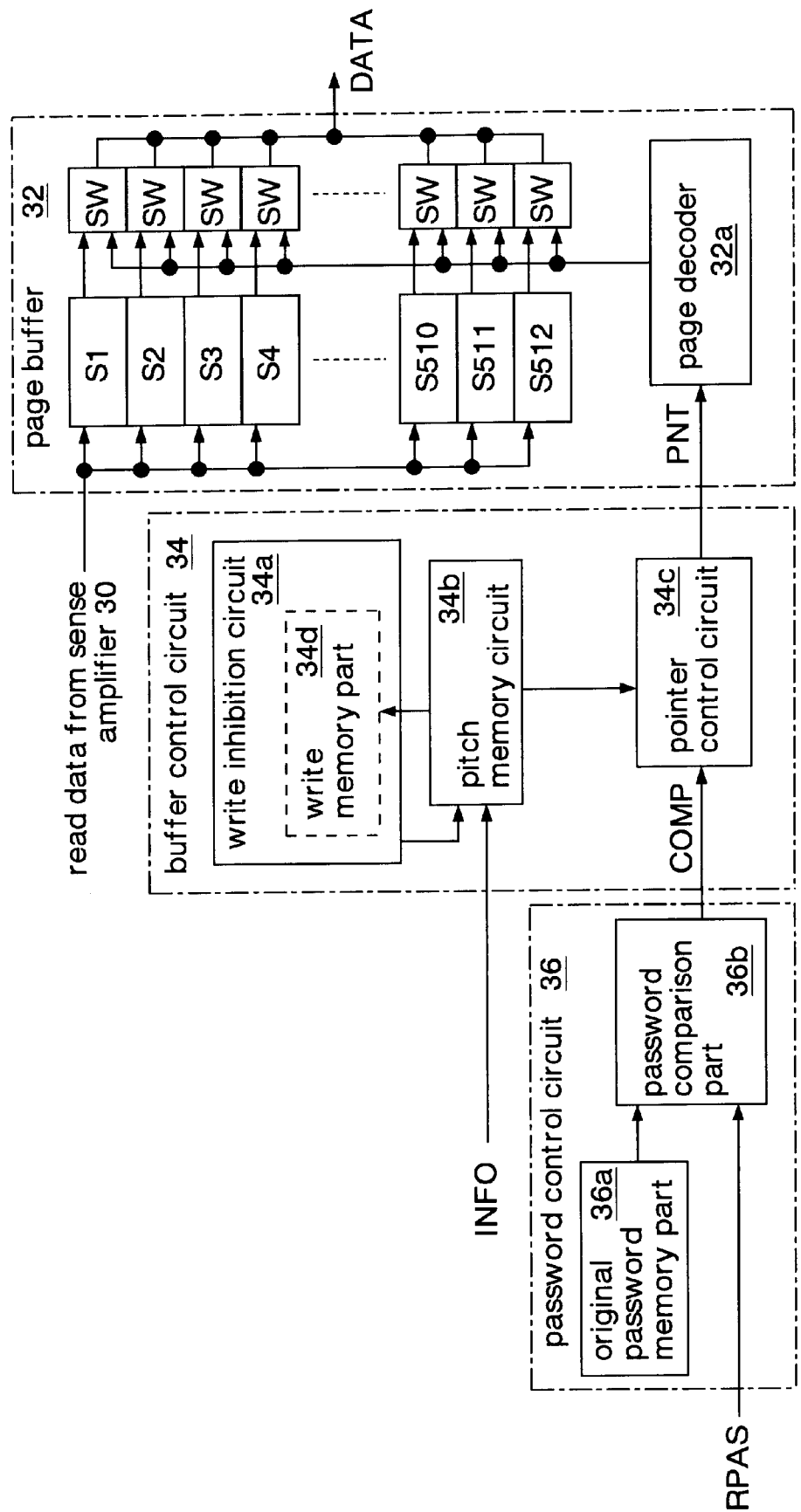
FIG. 2 is a block diagram showing the details of the essential parts of FIG. 1.

FIG. 2 shows the details of the password control circuit 36, the buffer control circuit 34, and the page buffer 32 shown in FIG. 1. The control signals CNT supplied to these circuits 36, 34, and 32 are omitted from the diagram. The page buffer 32 shows only the circuitry related to read operations.

The password control circuit 36 has an original password memory part 36a and a password comparison part 36b. The original password memory part 36a is composed of memory cells of floating gate type, the same as the memory cells of the memory cell array 26. The original password memory part 36a contains a correct password (original password) in advance. Since the original password is held in the electrically rewritable nonvolatile memory cells, the original password will not disappear even in the absence of power supply to the flash memory. The password comparison part 36b compares the original password and the read password RPAS supplied from exterior, and outputs the comparison result signal COMP.

The buffer control circuit 34 has a write inhibition circuit 34a, a pitch memory circuit 34b, and a pointer control circuit 34c. The write inhibition circuit 34a includes a write memory part 34d for storing write information that indicates the execution of write to the pitch control circuit 34b. The write inhibition circuit 34a permits writing the information signal INFO to the pitch control circuit 34b when the write memory part 34d contains no write information. The write inhibition circuit 34a inhibits new information signal INFO from being written to the pitch control circuit 34b when the write memory part 34 contains the write information. That is, the pitch in the pointer PNT cannot be changed if set once.

The pitch memory circuit 34b stores the information signal INFO which is supplied from exterior through the input/output control circuit 38. The information signal INFO contains information that indicates the pitch in the pointer PNT. The write memory part 34d and the pitch memory circuit 34b are composed of memory cells of floating gate type, the same as those of the memory cell array 26. Therefore, even in the absence of power supply to the flash memory, the write information stored in the write memory part 34d and the pitch written to the pitch memory circuit 34b will not disappear.

The pointer control circuit 34c increments the pointer PNT by one (normal read operation) when the comparison result signal COMP shows a match. When the comparison result signal COMP shows a mismatch, the pointer circuit 34c changes the pitch in the pointer PNT according to the pitch stored in the pitch memory circuit 34b (random read operation).

The page buffer 32, as described above, has 512 (512 bytes of) memory regions S1-S512 for receiving read data in parallel from the sense amplifier array 30, switches SW corresponding to the respective memory regions S1-S512, and a page decoder 32a for controlling the switches SW. The page decoder 32a turns on a predetermined switch SW according to the value of the pointer PNT. That is, in accordance with the update of the pointer PNT, read data (data DATA) is successively output from the page buffer 32.

Figure 3:
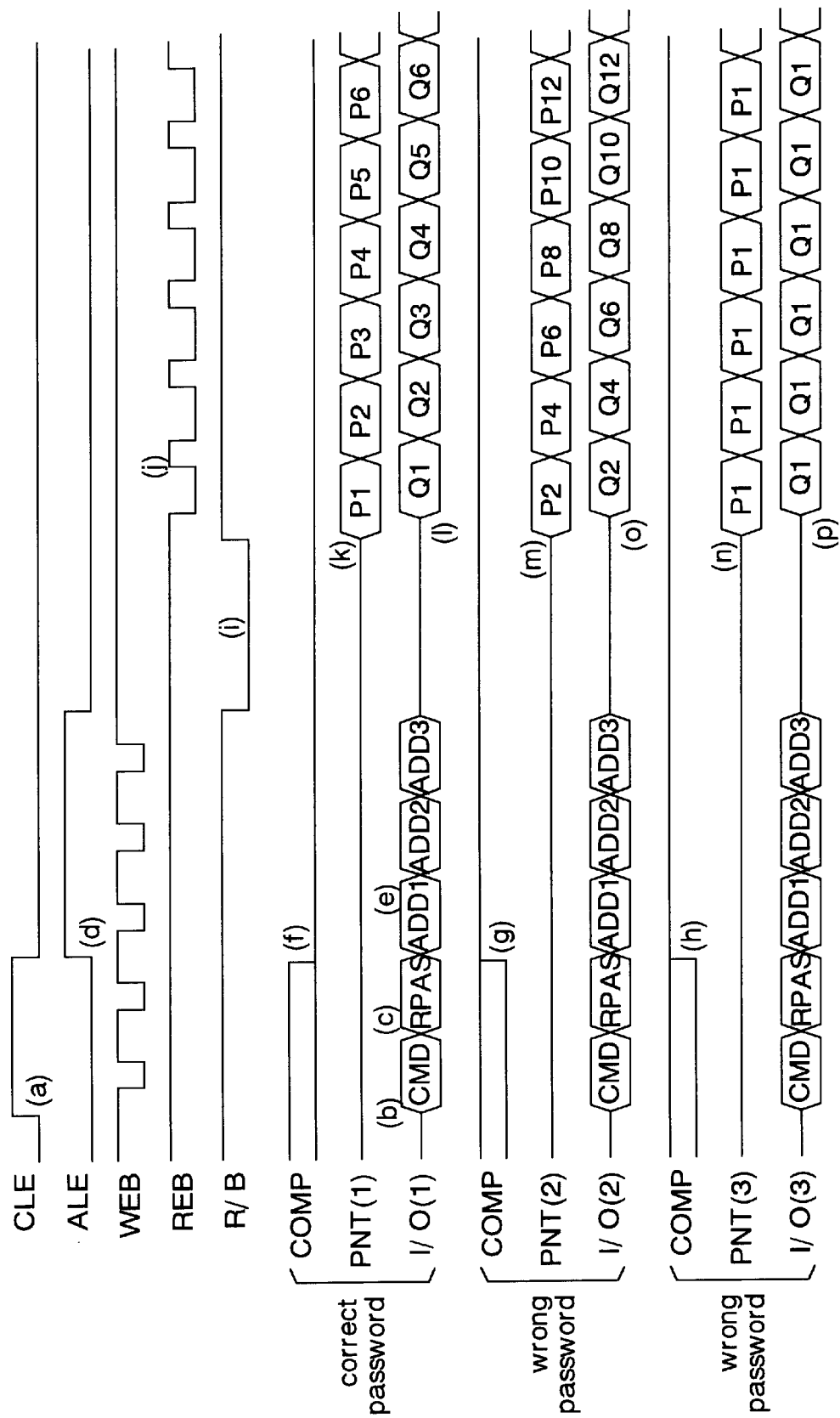
FIG. 3 is a timing chart showing read operations of the semiconductor memory device of the present invention.

FIG. 3 shows read operations of the flash memory described above.

In a read operation, the command latch enable signal CLE is activated initially (FIG. 3(a)). A command CMD and a read password RPAS are supplied successively in synchronization with the write enable signal WEB (FIGS. 3(b), (c)). Next, the address latch enable signal ALE is activated (FIG. 3(d)). Addresses ADD1, ADD2, and ADD3 are supplied successively in synchronization with the write enable signal WEB (FIG. 3(e)).

The password comparison part 36b shown in FIG. 2 compares the input read password RPAS and the original password, and outputs the comparison result signal COMP. If the comparison result is a match, the comparison result signal COMP turns to low level (FIG. 3(f)). If the comparison result is a mismatch, the comparison result signal COMP turns to high level (FIGS. 3(g), (h)).

Subsequently, the memory cell array 26 starts operating. A ready/busy terminal turns to low level over the period until read of data from the memory cell array 26 is enabled (FIG. 3(i)). In the busy period, the word line signal WL is selected according to the address, and data is read from the memory cells. The read data is amplified by the sense amplifiers. The data amplified by the sense amplifiers is transferred in parallel to the page buffer 32.

After the ready/busy terminal turns to high level, the read enable signal REB is activated a plurality of times consecutively (FIG. 3(j)). When the comparison result signal COMP is at low level, i.e., the read password RPAS is correct, the pointer control circuit 34c shown in FIG. 2 increments the pointer PNT by one in synchronization with the read enable signal REB (FIG. 3(k)). The page buffer 32 outputs read data Q1, Q2, Q3, . . . in succession from the memory regions S according to the pointer PNT (FIG. 3(l)). Here, the first pointer value P1 is a value according to the address ADD (read start address) supplied from exterior. That is, the data is read in order from the read start address and output through the input/output terminals I/O. When the read password RPAS is correct, the read operation is the same as heretofore except that the read password RPAS is input.

On the other hand, when the comparison result signal COMP is at high level, i.e., the read password RPAS is incorrect,. the pointer control circuit 34c increments the pointer PNT by two in synchronization with the read enable signal REB (FIG. 3(m)). Alternatively, the pointer control circuit 34c outputs the same pointer value P1 in synchronization with the read enable signal REB (FIG. 3(n)). As a result, read data is read from the page buffer 32 in random order and output through the input/output terminals I/O (FIG. 3(o), (p)). Incidentally, the pitch in the pointer PNTfor incorrect read passwords RPAS is not limited to the ones mentioned above. For example, the pitch in the pointer PNT may be three or any greater integer.

In this way, when the read password RPAS is incorrect, the pitch in the pointer PNT for controlling the page buffer 32 can be changed to output read data in random order. Thereby, security of the data stored in the flash memory is protected.

As has been described, according to the present embodiment, read data is output in random order when an incorrect read password RPAS is input. This allows security protection of the data written in the flash memory. Since the security protection is exercised in read operations according to the read password RPAS, the control circuitry necessary for data write operations may be the same as heretofore. The arrangement of the data written to the memory cell blocks is also the same as heretofore. For this reason, the security protection of the data can be effected by simple circuit modification and circuit addition. Consequently, the security protection mechanism can be added with a minimum increase in chip size.

When the read password RPAS is incorrect, read data is output though in random order. Therefore, those who try unauthorized data read cannot determine whether the output data is correct or not. This allows enhanced security protection as compared with the case of simply judging passwords.

When the read password RPAS is incorrect, the order of output of the data is changed by differentiating the pitch in the pointer PNT for controlling the page buffer 32 from in normal cases. That is, the security protection of the data can be easily achieved by simply manipulating the pointer PNT according to the read password RPAS.

Because of the provision of the pitch memory circuit 34b, the pitch in the pointer can be set freely by, for example, manufacturers of flash memories and manufacturers of memory cards that implement flash memories. Therefore, flash memories having various pitches in the pointer can be shipped for sure prevention of unauthorized read. In addition, the formation of the write inhibition circuit 34c can prevent the pitches written by the foregoing manufacturers from being tampered.

The pitch memory circuit 34b and the write memory part 34d of the write inhibition circuit 34a are composed of electrically rewritable nonvolatile memory cells, and the pitch and the write information are stored in these memory cells. The original password memory part 36a of the password control circuit 36 is also composed of electrically rewritable nonvolatile memory cells, and the original password is stored in these memory cells. Therefore, even in the absence of power supply to the flash memory, the pitch in the pointer, the write information, and the original password can be prevented from disappearing.

Furthermore, the present invention is applied to a NAND type flash memory that originally has the plurality of pages PAGE, the page buffer 32 having a memory capacity corresponding to that of the pages PAGE, and the buffer control circuit 34 for controlling the page buffer 32. Therefore, the NAND type flash memory having the security protection mechanism can be easily developed by simply modifying some of the circuits in the conventional flash memory.

The foregoing embodiment has dealt with the case where the original password memory part 36a is provided with electrically rewritable nonvolatile memory cells, and the original password is stored in these memory cells. However, the present invention is not limited to such an embodiment. For example, the original password memory part 36a may be provided with a plurality of fuses so that these fuses are blown according to the original password.

The foregoing embodiment has dealt with the case where the present invention is applied to a flash memory. However, the present invention is not limited to such an embodiment. For example, the present invention may be applied to EEPROMs other than flash memories.

The invention is not limited to the above embodiments and various modifications may be made without departing from the spirit and scope of the invention. Any improvement may be made in part or all of the components.

What is claimed is:

1. A semiconductor memory device comprising:
   a plurality of memory cell blocks;
   page buffer for holding read data read in parallel from said memory cell blocks and outputting the held data in order;
   a password control circuit for comparing a read password supplied during a read operation with an original password stored in advance, and outputting a result of comparison; and
   a buffer control circuit for changing the order said read data is output from said page buffer when the result of comparison is a mismatch.

2. The semiconductor memory device according to claim 1, wherein:
   said page buffer includes a plurality of memory regions for holding said read data, respectively; and
   said buffer control circuit includes a pointer control circuit for generating pointer values and, when the result of comparison is a mismatch, for differentiating the order said pointer values are generated from when the result of comparison is a match, said pointer values indicating which of said memory regions said read data is outputted from.

3. The semiconductor memory device according to claim 2, wherein said pointer control circuit outputs the identical pointer values consecutively when the result of comparison is a mismatch.

4. The semiconductor memory device according to claim 2, further comprising a pitch memory circuit for storing a pitch of said pointer values, and wherein said pointer control circuit generates said pointer values in said pitch when the result of comparison is a mismatch.

5. The semiconductor memory device according to claim 4, further comprising a write inhibition circuit for storing write information indicating that said pitch is written to said pitch memory circuit, and inhibiting thereafter any write to said pitch memory circuit based on said write information.

6. The semiconductor memory device according to claim 5, wherein said pitch memory circuit and said write inhibition circuit include electrically rewritable nonvolatile memory elements storing said pitch and said write information, respectively.

7. The semiconductor memory device according to claim 6, comprising a memory cell array of a NAND type flash memory.

8. The semiconductor memory device according to claim 1, wherein:

said password control circuit includes an original password memory part for storing said original password; and said original password memory part is composed of electrically rewritable nonvolatile memory elements.

9. The semiconductor memory device according to claim 8, comprising a memory cell array of a NAND type flash memory.

\* \* \* \* \*